(12) United States Patent
Yano

(10) Patent No.: US 8,304,028 B2
(45) Date of Patent: Nov. 6, 2012

(54) MESOPOROUS SILICA FILM

(75) Inventor: Toshihiro Yano, Wakayama (JP)

(73) Assignee: Kao Corporation, Tokyo (JP)

( * ) Notice: Subject to any disclaimer, the term of this patent is extended or adjusted under 35 U.S.C. 154(b) by 190 days.

(21) Appl. No.: 12/595,909

(22) PCT Filed: Apr. 2, 2008

(86) PCT No.: PCT/JP2008/056559
§ 371 (c)(1),
(2), (4) Date: Oct. 14, 2009

(87) PCT Pub. No.: WO2008/132943
PCT Pub. Date: Nov. 6, 2008

(65) Prior Publication Data
US 2010/0119809 A1 May 13, 2010

(30) Foreign Application Priority Data
Apr. 17, 2007 (JP) .................. 2007-108502

(51) Int. Cl.
*B05D 1/18* (2006.01)
(52) U.S. Cl. .............. 427/430.1; 427/245; 427/443.2
(58) Field of Classification Search ........ 427/248.1, 427/578, 249.15
See application file for complete search history.

(56) References Cited

U.S. PATENT DOCUMENTS
| | | | | |
|---|---|---|---|---|
| 6,329,017 | B1 * | 12/2001 | Liu et al. | 427/240 |
| 2002/0041932 | A1 * | 4/2002 | Ogawa | 427/376.2 |
| 2003/0012931 | A1 * | 1/2003 | Kuroda et al. | 428/188 |
| 2007/0037032 | A1 * | 2/2007 | Nishiyama et al. | 429/33 |

FOREIGN PATENT DOCUMENTS
| | | |
|---|---|---|
| JP | 2001-58812 A | 3/2001 |
| JP | 2001-130911 A | 5/2001 |
| JP | 2004-261779 A | 9/2004 |
| JP | 2005-59132 A | 3/2005 |

OTHER PUBLICATIONS

Chinese Office Action with an English translation dated Jun. 13, 2011, for Application No. 200880012081.X.
Sasaki et al., "Sojo Poly-silicates o Zenkutai to suru Suichoku Haiko Mesoporous Silica Maku no Seisei Process", Abstracts of Annual Meeting, Japan Association of Zeolite, Nov. 21, 2002, vol. 18th, p. 20.
Yamauchi et al., "30T Kyu Cho Kyojiba o Mochiita Mesoporous Silica Hakumaku Chu no Meso-channel no Suichoku Haiko", The Ceramic Society of Japan Nenkai Koen Yokoshu, Mar. 21, 2007, vol. 2007, p. 45.
Yamauchi et al., "Kyojiba Process ni yori Jitsugen sita Meso-channel no Suichoku Haiko", The Ceramic Society of Japan Nenkai Koen Yokoshu, Mar. 21, 2007, vol. 2007, p. 307.
Chinese Office Action dated Jun. 6, 2012 for Chinese Patent Application No. 200880012081.X with English translation.

* cited by examiner

*Primary Examiner* — David Turocy
(74) *Attorney, Agent, or Firm* — Birch, Stewart, Kolasch & Birch, LLP

(57) ABSTRACT

The present invention relates to (1) a mesoporous silica film having a mesoporous structure including meso pores having an average pore period of from 1.5 to 6 nm, wherein the meso pores are oriented in the direction of an angle of from 75 to 90° relative to a surface of the film; (2) a structure including a substrate and the mesoporous silica film formed on the substrate; and (3) a process for producing a mesoporous silica film structure which includes the steps of preparing an aqueous solution containing a specific amount of a specific cationic surfactant; immersing a substrate in the aqueous solution and then adding a specific amount of a silica source capable of forming a silanol compound when hydrolyzed, to the aqueous solution, followed by stirring the resulting mixture at a temperature of from 10 to 100° C., to form a mesoporous silica film on a surface of the substrate; and removing the cationic surfactant from the resulting mesoporous silica film structure.

12 Claims, 1 Drawing Sheet

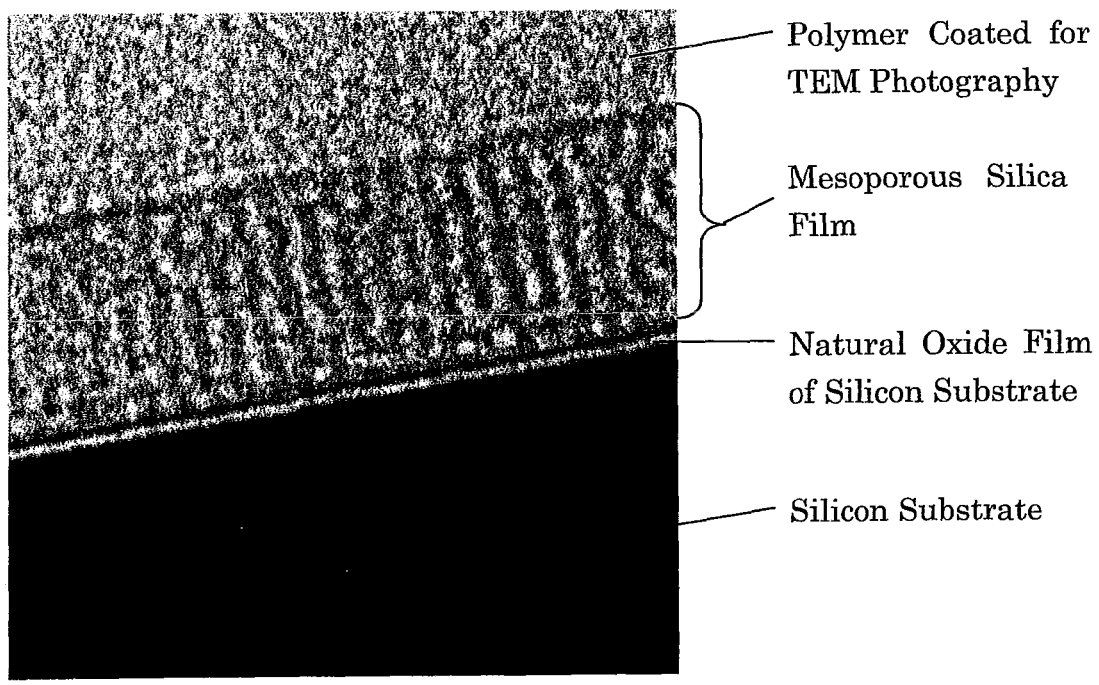

US 8,304,028 B2

MESOPOROUS SILICA FILM

FIELD OF THE INVENTION

The present invention relates to mesoporous silica films, mesoporous silica film structures, and a process for producing the structures.

BACKGROUND OF THE INVENTION

Materials with a porous structure have been extensively used as a carrier for catalysts and a carrier for fixedly supporting enzymes or functional organic compounds thereon because of a large surface area thereof. In particular, the materials with a porous structure having a sharp pore size distribution exhibit a function as a molecular sieve and are therefore usable in the applications such as a carrier for catalysts having a structural selectivity or a separating agent for various materials. In such applications, there is a demand for porous materials having uniform and fine pores.

As the porous materials having uniform and fine pores, mesoporous silica having meso-order pores has been developed. It has been noticed that the mesoporous silica is used in the applications such as nanowires, semiconductors and optical electronics in addition to those described previously.

Patent Document 1 discloses (i) a mesostructure having tubular mesopores which are oriented in the direction parallel with a surface of a polymer substrate and (ii) a method for forming a mesostructure having mesopores oriented in a given in-plane direction on a surface of a polymer substrate which includes the step of hydrolyzing an alkoxide under the condition that the oriented polymer surface is kept in contact with a surfactant and a liquid containing the alkoxide.

However, in the mesostructure, the mesopores are oriented in parallel with the surface of the substrate. Therefore, the mesostructure is usable as a highly-functional structure only in the limited applications.

On the other hand, Non-Patent Document 1 discloses a mesostructure which is produced by vertically orienting a micelle on a glass substrate in a ferromagnetic field. In view of a lattice spacing of the mesostructure as measured by a powder X-ray diffraction (XRD) method, it is suggested that the size of mesopores in the obtained mesostructure is as large as 5 nm or more.

Thus, there have been conventionally obtained no mesoporous silica films in which mesopores having an average pore period of 5 nm or less are oriented perpendicular to a substrate.

Patent Document 1: JP 2001-58812A
Non-Patent Document 1: "Journal of Materials Chemistry", 2005, 15, 1137-1140

SUMMARY OF THE INVENTION

The present invention relates to the following aspects (1) to (3).

(1) A mesoporous silica film having a mesoporous structure including meso pores having an average pore period of from 1.5 to 6 nm, wherein the meso pores are oriented in the direction of an angle of from 75 to 90° relative to a surface of the film.

(2) A mesoporous silica film structure including a substrate and a silica film formed on the substrate which has a mesoporous structure including meso pores having an average pore period of from 1.5 to 6 nm, wherein the meso pores are oriented in the direction of an angle of from 75 to 90° relative to a surface of the film.

(3) A process for producing a mesoporous silica film structure including mesopores oriented in the direction substantially perpendicular to a substrate, said process including the steps of:

(I) preparing an aqueous solution containing a cationic surfactant (a) at a concentration five times or less a critical micelle concentration thereof;

(II) immersing the substrate in the aqueous solution obtained in the step (I) and then adding a silica source (b) capable of forming a silanol compound when hydrolyzed, to the aqueous solution in such an amount that a concentration of the silica source in the aqueous solution is from 0.1 to 100 mmol/L, followed by stirring the resulting mixture at a temperature of from 10 to 100° C., to form a mesoporous silica film structure having a mesoporous silica film on a surface of the substrate; and (III) removing the cationic surfactant (a) from the resulting mesoporous silica film structure.

BRIEF DESCRIPTION OF THE DRAWING

FIG. 1 is a micrograph by a transmission electron microscope (TEM) showing the condition of perpendicular orientation of a mesoporous silica film obtained in Example 2 in which a black portion indicates a silicon wafer substrate.

DETAILED DESCRIPTION OF THE INVENTION

The present invention relates to a mesoporous silica film having mesopores oriented in the direction substantially perpendicular to a substrate, a mesoporous silica film structure, and a process for producing the structure.

<Mesoporous Silica Film>

The mesoporous silica film of the present invention has an average pore period owing to its mesoporous structure which is preferably in the range of from 1.5 to 6 nm, more preferably from 1.5 to 5 nm, still more preferably from 1.5 to 4.5 nm and further still more preferably from 1.5 to 4 nm.

The pore period of the mesopores as used herein means a distance between centers of most adjacent pores.

One feature of the pore period of the mesopores of the mesoporous silica film according to the present invention resides in such a sharp distribution that the mesopores being present in a region which is preferably 80% or more, more preferably 85% or more, still more preferably 90% or more and further still more preferably 95% or more of a whole of the film, have a pore period which falls within ±30% of the average pore period.

The pore period of the mesopores may be observed using a transmission electron microscope (TEM). The average pore period of the mesopores as used in the present invention is the value determined by the method described in Examples.

Another feature of the mesoporous silica film of the present invention reside in that the mesopores are oriented in the direction substantially perpendicular to the surface of the film, i.e., in the direction of an angle of from 75 to 90°, preferably from 75 to 90° and more preferably from 80 to 90° relative to the surface of the film. In the present invention, the angle of the mesopores relative to the surface of the film is also occasionally referred to as an orientation degree.

The average thickness of the mesoporous silica film is not particularly limited, and may vary depending upon the aimed applications of the mesoporous silica film. In view of the applications to a separation membrane, a highly-functional catalyst, etc., the average thickness of the mesoporous silica film is preferably from 1 to 500 nm, more preferably from 5 to 400 nm, still more preferably from 10 to 300 nm and further still more preferably from 20 to 200 nm.

The thickness of the mesoporous silica film may be adjusted by selection of the kind of a polymer used, agitation power upon mixing, concentration of reagents used, temperature of a solution, baking conditions, etc. The average thickness of the film may be measured by observation using a transmission electron microscope.

The structure of the mesoporous silica film varies depending upon the silica source used. When using the silica source having an organic group, the resulting film has a silica structure having the organic group. When adding, in addition to the silica source, a metal material such as an alkoxylate or a halide containing the other element, for example, a metal element such as Al, Ti, V, Cr, Co, Ni, Cu, Zn, Zr, B, Mn and Fe during or after production of the film, the metal element may be allowed to be present in the mesoporous silica film. From the viewpoint of a good stability of structure of the silica film, it is preferred that the film be produced by using tetramethoxysilane or tetraethoxysilane as the silica source, and the silica wall thereof is substantially constituted from silicon oxide.

<Process for Production of Mesoporous Silica Film Structure>

The process for producing the mesoporous silica film structure whose mesopores are oriented in the direction substantially perpendicular to the surface of the substrate according to the present invention includes the following steps (I) to (III).

Step (I): preparing an aqueous solution containing a cationic surfactant (a) at a concentration five times or less a critical micelle concentration thereof;

Step (II): immersing the substrate in the aqueous solution obtained in the step (I) and then adding a silica source (b) capable of forming a silanol compound when hydrolyzed, to the aqueous solution in such an amount that a concentration of the silica source in the aqueous solution is from 0.1 to 100 mmol/L, followed by stirring the resulting mixture at a temperature of from 10 to 100° C., to form a mesoporous silica film structure having a mesoporous silica film on a surface of the substrate; and Step (III): removing the cationic surfactant (a) from the resulting mesoporous silica film structure.

In the followings, the steps (I) and (II) as well as the respective components used in the steps are explained.

<Cationic Surfactant (a)>

The cationic surfactant as the component (a) is used for forming and dispersing the mesopores. The cationic surfactant is a compound having a critical micelle concentration (cmc). Examples of the cationic surfactant include primary to tertiary amine type compounds and quaternary ammonium salt type compounds. Among these compounds, preferred are those containing one or two alkyl or alkenyl groups having 4 to 22 carbon atoms as a group directly bonded to a nitrogen atom which may be interrupted by an ester bond, an amide bond or an ether bond, and a residual group(s) selected from the group consisting of a hydrogen atom, an alkyl or hydroxyalkyl group having 1 to 3 carbon atoms and a benzyl group.

Of these cationic surfactants, more preferred are quaternary ammonium salt type cationic surfactants, and most preferred are quaternary ammonium salts represented by the following general formula (1):

$$[R^1R^2R^3R^4N]^+X^- \quad (1)$$

wherein $R^1$ and $R^2$ are each independently a linear or branched alkyl or alkenyl group having 1 to 22 carbon atoms, with the proviso that at least one of $R^1$ and $R^2$ has 4 or more carbon atoms; $R^3$ and $R^4$ are respectively an alkyl or hydroxyalkyl group having 1 to 3 carbon atoms or a benzyl group, with the proviso that $R^3$ and $R^4$ are not benzyl groups at the same time; and X is a monovalent anion.

In the above general formula (1), it is preferred that each of $R^1$ and $R^2$ be a leaner or branched alkyl group having preferably 4 to 22 carbon atoms, more preferably 6 to 18 carbon atoms and still more preferably 8 to 16 carbon atoms, and it is more preferred that at least one of $R^1$ and $R^2$ be a methyl group.

Examples of the alkyl group having 4 to 22 carbon atoms as $R^1$ and $R^2$ include various butyl groups, various pentyl groups, various hexyl groups, various heptyl groups, various octyl groups, various nonyl groups, various decyl groups, various dodecyl groups, various tetradecyl groups, various hexadecyl groups, various octadecyl groups and various eicosyl groups. Among these groups, $R^1$ and $R^2$ are preferably a methyl group.

X in the general formulae (1) is preferably at least one monovalent anion selected from the group consisting of a halide ion, a hydroxide ion, a nitrate ion and a sulfate ion from the viewpoint of attaining a high crystallizability. X is more preferably a halide ion, still more preferably a chloride ion or a bromide ion and most preferably a bromide ion.

Examples of the alkyltrimethyl ammonium salt represented by the general formula (1) include butyltrimethyl ammonium chloride, hexyltrimethyl ammonium chloride, octyltrimethyl ammonium chloride, decyltrimethyl ammonium chloride, dodecyltrimethyl ammonium chloride, tetradecyltrimethyl ammonium chloride, hexadecyltrimethyl ammonium chloride, stearyltrimethyl ammonium chloride, butyltrimethyl ammonium bromide, hexyltrimethyl ammonium bromide, octyltrimethyl ammonium bromide, decyltrimethyl ammonium bromide, dodecyltrimethyl ammonium bromide, tetradecyltrimethyl ammonium bromide, hexadecyltrimethyl ammonium bromide and stearyltrimethyl ammonium bromide.

Examples of the dialkyldimethyl ammonium salt represented by the general formula (1) include dibutyldimethyl ammonium chloride, dihexyldimethyl ammonium chloride, dioctyldimethyl ammonium chloride, dihexyldimethyl ammonium bromide, dioctyldimethyl ammonium bromide, didodecyldimethyl ammonium bromide and ditetradecyldimethyl ammonium bromide.

Among these cationic surfactants (a), from the viewpoint of forming regular mesopores, especially preferred are the alkyltrimethyl ammonium salts, more preferred are alkyltrimethyl ammonium bromides and alkyltrimethyl ammonium chlorides, and still more preferred are dodecyltrimethyl ammonium bromide and dodecyltrimethyl ammonium chloride.

<Silica Source (b)>

The component (b) is a silica source capable of producing a silanol compound by hydrolysis. As the silica source (b), there are preferably used alkoxysilanes. More specifically, the silica source includes compounds represented by the following general formulae (2) to (6):

$$SiY_4 \quad (2);$$

$$R^5SiY_3 \quad (3);$$

$$R^5_2SiY_2 \quad (4);$$

$$R^5_3SiY \quad (5);$$

and $$Y_3Si-R^6-SiY_3 \quad (6),$$

wherein $R^5$ groups are each independently an organic group having a carbon atom directly bonded to a silicon atom; $R^6$ is a hydrocarbon group having 1 to 4 carbon atoms or a phenylene group; and Y is a monovalent hydrolysable group capable of being hydrolyzed into a hydroxyl group.

In the general formulae (2) to (6), the $R^5$ groups are preferably each independently a hydrocarbon group having 1 to 22 carbon atoms in which a part of hydrogen atoms may be substituted with a fluorine atom. Specific examples of $R^5$ include an alkyl group having 1 to 22 carbon atoms, preferably 4 to 18 carbon atoms, more preferably 6 to 18 carbon atoms and still more preferably 8 to 16 carbon atoms, a phenyl group or a benzyl group. $R^6$ is preferably an alkanediyl group having 1 to 4 carbon atoms (such as a methylene group, an ethylene group, a trimethylene group, a propane-1,2-diyl group and a tetramethylene group) or a phenylene group. Y is preferably an alkoxy group having 1 to 22 carbon atoms, preferably 1 to 8 carbon atoms and more preferably 1 to 4 carbon atoms, or a halogen group except for fluorine.

Examples of the suitable silica source (b) include the following compounds.

Silane compounds of the general formula (2) in which Y is an alkoxy group having 1 to 3 carbon atoms, or a halogen group except for fluorine.

Trialkoxysilanes or dialkoxysilanes of the general formula (3) or (4) in which $R^5$ is a phenyl group, a benzyl group, or a hydrocarbon group having 1 to 20 carbon atoms, preferably 1 to 10 carbon atoms and more preferably 1 to 5 carbon atoms in which a part of hydrogen atoms may be substituted with a fluorine atom.

Compounds of the general formula (6) in which Y is a methoxy group, and $R^6$ is a methylene group, an ethylene group or a phenylene group.

Among these compounds, especially preferred are tetramethoxysilane, tetraethoxysilane, phenyl triethoxysilane and 1,1,1-trifluoropropyl triethoxysilane.

<Step (I)>

The contents of the cationic surfactant (a) and the silica source (b) in the aqueous solution prepared in the step (I) are as follows.

The content of the component (a) in the aqueous solution is preferably five times or less, more preferably three times or less and still more preferably two times or less the critical micelle concentration in 20° C. water, from the viewpoint of attaining a high perpendicular orientation, more specifically, from the viewpoint of preventing the formed micelle from being adsorbed in the direction horizontal to the substrate and orienting the micelle in the direction perpendicular thereto. The lower limit of the content of the component (a) is preferably 0.01 time or more and more preferably 0.05 time or more the critical micelle concentration.

The content of the component (b) is preferably from 0.1 to 100 mmol/L, preferably from 1 to 100 mmol/L and more preferably from 5 to 80 mmol/L.

The aqueous solution used in the step (I) is preferably an alkaline solution, and the pH value of the aqueous solution is more preferably from 9 to 12, still more preferably from 10 to 12 and further still more preferably from 11 to 12.

The aqueous solution containing the components (a) and (b) may also contain the other components including an organic compound such as methanol, an inorganic compound, etc., unless they adversely affect formation of the mesoporous silica film of the present invention. When it is desirable to incorporate the other element in addition to silica and the organic groups into the mesoporous silica film, the raw metal material such as an alkoxylate and a halide containing the metal element may be added during or after production of the mesoporous silica film, as described above.

<Step (II)>

In the step (II), the mesoporous silica film structure is formed. The substrate is immersed in the aqueous solution obtained in the step (I), and then the silica source (b) capable of forming a silanol compound when hydrolyzed, is added to the aqueous solution in such an amount that a concentration of the silica source in the aqueous solution is from 0.1 to 100 mmol/L, followed by stirring the resulting solution at a temperature of from 10 to 100° C. and preferably from 10 to 80° C. and then allowing the substrate to stand in the solution. As a result, it is possible to obtain a mesoporous silica film structure including the substrate and a mesoporous silica film formed on the surface of the substrate which has mesopores and is constituted from the cationic surfactant (a) and the silica source (b).

The stirring time of the aqueous solution obtained in the step (I) varies depending upon the temperature used in the step (II), and the stirring is usually conducted at a temperature of from 10 to 80° C. for a period of from 0.1 to 24 h. During the stirring period, the mesoporous silica film is formed on the substrate.

<Substrate>

The material of the substrate used in the mesoporous silica film structure of the present invention is not particularly limited as long as it is free from dissolution or deformation under the conditions for production of the mesoporous silica film. Specific examples of the material of the substrate include metals, metal oxides, glass, water-insoluble polymers, silicon, germanium, minerals (such as, for example, quartz), and semiconductor materials (such as, for example, doped silicon and doped germanium) and ceramics.

The shape of the substrate is also not particularly limited. Examples of the shape of the substrate include plane-containing shapes such as a disk shape, a plate shape, a slab shape and a prism shape, curvature-containing shapes such as a lens shape.

The surface of the substrate may be coated with a polymer that is insoluble in the reaction solution.

Examples of the metals or metal oxides include one or more metals selected from the group consisting of Si, Ta, Nb, Ga, Al, Ti, Zr, Hf, V, Nb, Ta, Cr, Mo, W, Mn, Fe, Re, Os, Co, Rh, Ir, Ni, Pd, Pt, Cu, Ag, Au, Zn, Cd, La, Gd, Cs, Ga, In and Ru, and metal oxides and alloys of these metals.

<Water-Insoluble Polymer>

Examples of the suitable water-insoluble polymer constituting the substrate include cationic polymers, nonionic polymers and amphoteric polymers which are made of polyethylene, polypropylene, polyamides, polyethylene terephthalate, polybutylene terephthalate, polyimides, etc.

<Cationic Polymer>

The cationic polymer used in the present invention is preferably dispersible in a medium containing an aqueous continuous phase in the form of a polymer emulsion in the presence of a cationic surfactant. More specifically, the cationic polymer is preferably such a cationic polymer obtained by subjecting a monomer mixture containing a cationic monomer, in particular, a cationic group-containing ethylenically unsaturated monomer, to emulsion polymerization in the presence of a cationic surfactant.

Examples of the cationic monomer include an acid-neutralized product of an amino group-containing monomer and a quaternary ammonium salt obtained by quaternarization of the above monomer using a quaternarizing agent.

The amino-group-containing monomer is preferably at least one compound selected from the group consisting of dialkylamino group- or trialkyl ammonium group-containing (meth)acrylic acid esters or (meth)acrylamides, dialkylamino group-containing styrenes, vinyl pyridines, N-vinyl heterocyclic compounds, amino-group-containing vinyl ethers, and allyl amines.

Specific examples of the dialkylamino group-containing (meth)acrylic acid esters include dimethylaminoethyl (meth)acrylate, diethylaminoethyl (meth)acrylate, dipropylaminoethyl (meth)acrylate, diisopropylaminoethyl (meth)acrylate, dibutylaminoethyl (meth)acrylate, diisobutylaminoethyl (meth)acrylate and di-t-butylaminoethyl (meth)acrylate. Meanwhile, the term "(meth)acrylic acid" as used herein means "acrylic acid, methacrylic acid or a mixture thereof", and the term "(meth)acrylate" as used herein also means "acrylate, methacrylate or a mixture thereof".

The acid-neutralized product of the amino group-containing monomer may be obtained by mixing the above amino group-containing monomer with an acid. Examples of the suitable acid include hydrochloric acid, sulfuric acid, nitric acid, acetic acid, maleic acid, fumaric acid, citric acid, tartaric acid, adipic acid, toluenesulfonic acid, lactic acid and succinic acid.

The quaternary ammonium salt obtained by quaternarization of the amino group-containing monomer using a quaternarizing agent may be obtained by treating the amino group-containing monomer with the quaternarizing agent. Examples of the quaternarizing agent include alkylating agents, e.g., alkyl halides such as methyl chloride, ethyl chloride, methyl bromide and methyl iodide; and dialkyl sulfates such as dimethyl sulfate, diethyl sulfate and di-n-propyl sulfate. Examples of the diallyl-type quaternary ammonium salts include dimethyldiallyl ammonium chloride and diethyldiallyl ammonium chloride.

Among these cationic monomers, preferred are (meth)acrylic acid esters having a dialkylamino group or a trialkyl ammonium group, and most preferred are (meth)acrylic acid esters having a dialkylamino group or a trialkyl ammonium group.

The cationic polymer may also contain, in addition to the constitutional unit derived from the above cationic monomer, a constitutional unit derived from a hydrophobic monomer such as alkyl (meth)acrylates and aromatic ring-containing monomers as well as a constitutional unit derived from the other copolymerizable monomer. Examples of the suitable hydrophobic or other copolymerizable monomer include alkyl (meth)acrylates containing an alkyl group having 3 to 22 carbon atoms, styrene-based monomers such as styrene and 2-methyl styrene, aryl esters of (meth)acrylic acid such as benzyl(meth)acrylate, vinyl monomers containing an aromatic group having 6 to 22 carbon atoms, and vinyl acetate. Among these monomers, preferred are alkyl(meth)acrylates and styrene.

The cationic polymer may be produced by subjecting a monomer mixture containing a cationic group-containing ethylenically unsaturated monomer to emulsion polymerization in the presence of a cationic surfactant by a known method.

Examples of the cationic surfactant used in the polymerization include nitrogen-based cationic group-containing compounds, and compounds capable of exhibiting a cationic property by adjusting a pH thereof. Specific examples of the cationic surfactant include alkyl amine salts, quaternary ammonium salts, alkyl betaines and alkyl amine oxides. Among these cationic surfactants, especially preferred are quaternary ammonium salts.

As the polymerization initiator, there may be used known inorganic peroxides, organic initiators, redox agents, etc.

<Other Polymers>

The nonionic polymer may be produced by polymerizing a nonionic monomer incapable of exhibiting an electric charge. As the nonionic monomer, there may be used the hydrophobic monomers as previously described with respect to the cationic polymer. Examples of the suitable nonionic monomer include one or more compounds selected from the group consisting of alkyl (meth)acrylates containing an alkyl group having 3 to 22 carbon atoms, vinyl acetate and styrene.

Examples of the nonionic polymer include polymers constituted from the hydrophobic monomer, and copolymers of the hydrophobic monomer with at least one nonionic monomer selected from the group consisting of vinyl pyrrolidone, vinyl alcohol, ethyleneoxide, polyethyleneoxide (meth)acrylate and acrylamide.

Specific examples of the nonionic polymer include polystyrene, ethyl acrylate-ethyl methacrylate copolymers, ethyl acrylate-methyl methacrylate copolymers, octyl acrylate-styrene copolymers, butyl acrylate-vinyl acetate copolymers, methyl methacrylate-butyl acrylate-octyl acrylate copolymers, vinyl acetate-styrene copolymers, vinyl pyrrolidone-styrene copolymers, butyl acrylate and polystyrene acrylic acid resins.

Examples of the amphoteric polymer include copolymers of a monomer containing an anionic group such as a carboxyl group and a sulfonic group with the above-mentioned cationic monomer, polymers or copolymers of a carboxybetaine-type monomer, cationic polymers into which an anionic group such as a carboxyl group or a sulfonic group is introduced, and anionic polymers into which a basic nitrogen-containing group is introduced. The amphoteric polymer preferably contains a constitutional unit derived from the above hydrophobic monomer as a main component.

Among the cationic polymers, nonionic polymers and amphoteric polymers, preferred are the cationic polymers and the nonionic polymers. From the viewpoint of facilitated production of the mesoporous silica film, more preferred are the cationic polymers.

Examples of the suitable water-insoluble polymer include a copolymer of a hydrophobic monomer selected from the group consisting of an alkyl (meth)acrylate and styrene with a cationic group-containing (meth)acrylate, and a nonionic polymer obtained from at least one hydrophobic monomer selected from the group consisting of an alkyl (meth)acrylate and styrene.

These polymers may be used alone or in the form of a mixture of any two or more thereof.

<Surface Treatment of Substrate>

In the production process of the present invention, the above-mentioned substrate may be used as such or may be further treated, for example, by a Langmuir-Blodgett's (LB) method to form a LB film thereon for controlling a surface condition of the substrate. In addition, the LB film formed on the substrate may be further subjected to heat treatments, etc., to attain such a surface condition which undergoes a change in chemical structure thereof while keeping the accumulated structure of the LB film.

<Step (III)>

In the step (III), the mesoporous silica film structure obtained in the step (II) is taken out of water, and then the cationic surfactant (a) is removed from the structure, if required, after being washed with water and dried.

The inside of the respective mesopores in the mesoporous silica film of the mesoporous silica film structure obtained in the step (II) is filled with the cationic surfactant (a). Therefore, the cationic surfactant is removed from the mesopores to form empty mesopores, so that the resulting mesoporous silica film structure can be used as a highly-functional material.

The removal of the cationic surfactant (a) from the mesopores may be carried out by various methods such as baking and extraction.

In the baking method, if the baking temperature is too low, there is possibility that the cationic surfactant (a) as a mesopore-forming agent remains in the mesopores. On the other hand, when the baking temperature is too high, there occurs such a risk that the pore structure is broken. For this reason, the mesoporous silica film structure is preferably baked in an electric oven, etc., at a temperature of preferably from 350 to 650° C., more preferably from 450 to 650° C. and still more preferably from 480 to 650° C. for 1 to 10 h. With this baking treatment, the cationic surfactant (a) may be removed from the meso structure substantially without breaking of the meso structure.

When using the extraction method, although it is difficult to completely remove the cationic surfactant (a) from the mesoporous silica film structure, it is possible to produce a structure in which the mesoporous silica film is formed on a substrate made of a material incapable of withstanding the baking treatment. For example, the mesoporous silica film structure may be dipped in an aqueous solution having a pH of 1 to 4 at a temperature ranging from room temperature to 80° C., and stirred for a long period of time to extract the cationic surfactant (a) therefrom, thereby enabling production of a suitable mesoporous silica film structure. In addition, the extraction method may also be conducted by using a super-critical fluid.

According to the above production process, it is possible to produce a mesoporous silica film structure in which a silica film having a mesoporous structure including mesopores whose average pore period is from 1.5 to 6 nm is formed on a substrate, and the mesopores are oriented in the direction of an angle of from 75 to 90° relative to the substrate.

Meanwhile, when the substrate has a shape including a curved portion, the orientation degree of the mesopores in the silica film which ranges from 75 to 90° means an angle of the mesopores relative to a tangential line of the curved portion.

When the substrate of the mesoporous structure is made of a water-insoluble polymer, the structure may be washed with a solvent capable of dissolving the polymer to peel off the mesoporous silica film from the substrate or completely dissolve the water-insoluble polymer substrate, thereby taking out the mesoporous silica film solely. Alternatively, the water-insoluble polymer substrate may also be completely burned out to take out the mesoporous silica film solely.

In the present invention, when the configuration of the mesoporous silica film is previously controlled in a desired condition, it is possible to readily obtain a mesoporous silica film structure having a desired configuration.

Meanwhile, in the case where the cationic surfactant (a) is used in the step of producing the mesoporous silica film, there is possibility that the cationic surfactant (a) remains within the mesoporous silica film, in the mesopores or on the surface of the film. If the residual cationic surfactant (a) induces no significant problems, it is not necessarily required to positively remove the residual surfactant. However, when removal of the residual cationic surfactant (a) is desirable, the resulting mesoporous silica film may be washed with water or an acid aqueous solution to remove the residual cationic surfactant therefrom.

In the mesoporous silica film and the mesoporous silica film structure according to the present invention, an apparent (tentative) area of the film as a theoretical film, i.e., an area of the film as a macro film in which the presence of pores is not taken into consideration, is not particularly limited. When the production process is started from a film having an extremely small area and continuously proceeds, it is possible to produce a film having an optional area up to an extremely large area. For example, according to the present invention, it is possible to produce a film having an area of 1 $mm^2$ or larger as the apparent area in which the presence of pores is not taken into consideration. In fact, according to the present invention, the film having an area of 1000 $mm^2$ has been produced, and it will be possible to produce even a film having an area of about 10000 $mm^2$.

EXAMPLES

Various properties of the mesoporous silica films obtained in the following Examples and Comparative Examples were measured by the following methods.

<Film Thickness, Average Pore Period of Mesopores, and Orientation Degree>

Using a transmission electron microscope (TEM) "JEM-2100" available from JEOL Ltd., the measurements were respectively performed at an acceleration voltage of 160 kV by observing each sample at two positions to determine a thickness of the film, an average pore period of the mesopores, and an orientation degree thereof. The respective samples to be observed were prepared by cutting a mesoporous silica film along the direction perpendicular to the film and polishing the cut film into a thin thickness to such an extent that a suitable transmission image thereof was observed by the transmission electron microscope. The thus prepared sample was attached onto a Cu mesh "200-A Mesh" (available from Okenshoji Co., Ltd.) with a high resolution carbon supporting membrane and then observed.

(1) The average pore period of mesopores in the sample was determined from the above transmission image obtained by the electron microscope as follow. That is, a width of a region to be observed in the sample was optionally selected such that at least three pore tubes extending in the direction substantially perpendicular to the substrate are included therein. The distance between estimated centers of two pore tubes located on both ends of the region was measured, and the thus measured distance was divided by the number of pore tubes being present between the both ends of the region to calculate a pore period thereof. The above measurement of the pore period was carried out at 50 locations optionally selected from images at the two positions in each sample, and an average value of the thus measured values was calculated and determined as an average periodicity thereof.

(2) The measurement of thickness of the film was carried out at 50 locations optionally selected from images at the two positions in each sample, and an average value of the thus measured values was calculated and determined as a film thickness thereof.

(3) The orientation degree was determined as the numeral value obtained by measuring an extent of perpendicularity of pore tubes extending in the substantially perpendicular direction from the substrate, i.e., by measuring an angle of the pore tubes relative to the surface of the substrate. The orientation degree was determined as a numeral value within the range of from a right angle to an acute angle, and if the value is an obtuse angle, the orientation degree was determined as the value obtained by subtracting the value from 180°. The measurement of the orientation degree was carried out at 50 locations optionally selected from images at the two positions in each sample, and an average value of the thus measured values was calculated and determined as an orientation degree thereof.

Production Example 1

Production of Cationic Polymer

A 2 L separable flask was charged with 600 parts of ion-exchanged water, 99.5 parts of methyl methacrylate and 0.5 part of methacryloyloxyethyltrimethyl ammonium chloride, and an inside temperature of the flask was raised to 70° C. Next, a solution prepared by dissolving 0.5 part of 2,2'-azobis (2-amidinopropane) dihydrochloride "V-50" (tradename) available from Wako Pure Chemical Industries, Ltd., as a water-soluble initiator, in 5 parts of ion-exchanged water, was added to the flask, and the contents of the flask were heated under stirring for 3 h. Thereafter, the resulting mixture was further heated at 75° C. under stirring for 3 h. After cooling, the resulting liquid mixture was filtered through a 200 mesh filter (opening: about 75 µm) to remove aggregates therefrom. The thus obtained filtrate was heated and concentrated using an evaporator, and then cooled. Thereafter, the resulting concentrated solution was filtered through a 1.2 µm membrane filter "Minisart" (tradename) available from Sartorius Inc., and conditioned with ion-exchanged water, thereby obtaining a suspension of cationic polymer particles [solid (effective ingredient) content: 40%; average particle diameter: 312 nm].

The thus obtained suspension was dried at 80° C. over one night to obtain a solid. The thus obtained solid was dissolved in dichloromethane to prepare a 10% solution.

Example 1

Production of Cationic Polymer Substrate/Mesoporous Silica Film Structure

The dichloromethane solution of the cationic polymer obtained in Production Example 1, was applied onto a surface of a silicon wafer [available from the Nilaco Corp.; n-type low-resistance type (100)] by a dip-coating method to form a thin film of the cationic polymer thereon.

A 100 mL flask was charged with 60 g of water, 20 g of methanol, 0.46 g of a 1M sodium hydroxide aqueous solution and 0.35 g of dodecyltrimethyl ammonium bromide, and the contents of the flask were mixed with each other under stirring to prepare an aqueous solution. The above obtained wafer on which the cationic polymer thin film was formed, was dipped in the thus prepared aqueous solution, and then 0.34 g of tetramethoxysilane was slowly added thereto. The resulting mixture was stirred for 2 min, and then the wafer was taken out therefrom. The thus obtained wafer was washed with water and dried at 80° C. for 12 h, and then heated in air at 600° C. for 2 h, thereby obtaining a structure constituted from the wafer and a perpendicular oriented film of mesoporous silica formed on the wafer. The concentration of dodecyltrimethyl ammonium bromide in the solution used in the above reaction was 13 mmol/L which was 0.8 time 16 mmol/L as a critical micelle concentration of dodecyltrimethyl ammonium bromide as measured in water at 20° C.

It was confirmed that the thickness of the resulting mesoporous silica film was 18 nm, the average pore period of mesopores in the film was 3.5 nm, and the average angle of the mesopores relative to the substrate was 82°.

Example 2

Production of Silicon Wafer Substrate/Mesoporous Silica Film Structure

The same procedure as in Example 1 was repeated except that the silicon wafer [available from the Nilaco Corp.; n-type low-resistance type (100)] was used as such in place of the wafer formed thereon with the cationic polymer thin film, thereby obtaining a structure constituted from the wafer and a perpendicular oriented film of mesoporous silica formed on the wafer.

It was confirmed that the thickness of the resulting mesoporous silica film was 19 nm, the average pore period of mesopores in the film was 2.7 nm, and the average angle of the mesopores relative to the substrate was 89°.

FIG. 1 is a microphotograph by a transmission electron microscope (TEM) showing a perpendicular orientation condition of the thus obtained mesoporous silica film.

Example 3

Production of Silicon Wafer Substrate/Mesoporous Silica Film Structure

The same procedure as in Example 1 was repeated except that the silicon wafer [available from the Nilaco Corp.; p-type low-resistance type (100)] was used in place of the wafer formed thereon with the cationic polymer thin film, thereby obtaining a structure constituted from the wafer and a perpendicular oriented film of mesoporous silica formed on the wafer.

It was confirmed that the thickness of the resulting mesoporous silica film was 18 nm, the average pore period of mesopores in the film was 2.8 nm, and the average angle of the mesopores relative to the substrate was 88°.

Industrial Applicability

The mesoporous silica film of the present invention has a mesoporous structure having a large specific surface area. Therefore, it is expected that the mesoporous silica film is used in various applications including, for example, a separation membrane having a structural selectivity, a highly-functional catalyst, an adsorbent, a carrier on which an enzyme or a functional organic material is fixedly supported, etc. In addition, the mesoporous silica film structure of the present invention can also be used as a functional material in various applications.

According to the production process of the present invention, the mesoporous silica film structure in which mesopores are oriented in the direction substantially perpendicular to the substrate can be produced in an efficient manner.

What is claimed is:

1. A process for producing a mesoporous silica film structure comprising mesopores oriented in the direction substantially perpendicular to a surface of a substrate, said process comprising the steps of:
(I) preparing an aqueous solution having a pH of 9 to 12 and containing a cationic surfactant (a) at a concentration five times or less a critical micelle concentration thereof;
(II) immersing the substrate in the aqueous solution obtained in the step (I) and then adding a silica source (b) capable of forming a silanol compound when hydrolyzed, to the aqueous solution in such an amount that a concentration of the silica source in the aqueous solution is from 0.1 to 100 mmol/L, followed by stirring the resulting mixture at a temperature of from 10 to 100° C., to form a mesoporous silica film structure having a mesoporous silica film on the surface of the substrate; and (III) removing the cationic surfactant (a) from the resulting mesoporous silica film structure.

2. The process according to claim 1, wherein the mesopores are oriented in the direction of an angle of from 75 to 90° relative to the surface of the substrate.

3. The process according to claim 1, wherein the mesoporous silica film structure has an average pore period of 1.5 to 6 nm.

4. The process according to claim 1, wherein the cationic surfactant (a) is an alkyltrimethyl ammonium salt.

5. The process according to claim 1, wherein the cationic surfactant (a) is an alkyltrimethyl ammonium salt wherein the alkyl group has 8 to 16 carbon atoms.

6. The process according to claim 1, wherein the cationic surfactant (a) is an alkyltrimethyl ammonium halide.

7. The process according to claim 1, wherein the cationic surfactant (a) is an alkyltrimethyl ammonium halide wherein the alkyl group has 8 to 16 carbon atoms.

8. The process according to claim 1, wherein the silica source (b) is a compound represented by:

$SiY_4$ wherein Y is an alkoxy group having 1 to 3 carbon atoms.

9. The process according to claim 1, wherein the content of the cationic surfactant (a) in the aqueous solution is 0.01 times or more the critical micelle concentration thereof.

10. The process according to claim 1, wherein the aqueous solution further comprises a sodium hydroxide aqueous solution.

11. The process according to claim 1, wherein the cationic surfactant (a) is dodecyltrimethyl ammonium bromide.

12. The process according to claim 1, wherein the silica source (b) is tetramethoxysilane.

* * * * *